(12) United States Patent
Ni

(10) Patent No.: US 7,710,134 B2
(45) Date of Patent: May 4, 2010

(54) PROBE CARD ASSEMBLY

(75) Inventor: Cheng-Chin Ni, Hsin-Chu (TW)

(73) Assignee: King Yuan Electronics Co., Ltd, Hsinchu (TW)

( * ) Notice: Subject to any disclaimer, the term of this patent is extended or adjusted under 35 U.S.C. 154(b) by 134 days.

(21) Appl. No.: 12/199,843

(22) Filed: Aug. 28, 2008

(65) Prior Publication Data

US 2009/0315577 A1    Dec. 24, 2009

(30) Foreign Application Priority Data

Jun. 19, 2008   (TW)  .............................. 97122938 A

(51) Int. Cl.
*G01R 31/02*    (2006.01)
(52) U.S. Cl. ...................... 324/754; 324/762
(58) Field of Classification Search ........................ None
See application file for complete search history.

(56) References Cited

U.S. PATENT DOCUMENTS

| 5,670,889 | A | 9/1997 | Okubo et al. |
| 6,137,297 | A | 10/2000 | McNair et al. |
| 6,478,596 | B2 | 11/2002 | Yoshida et al. |
| 6,515,358 | B1 | 2/2003 | Dass et al. |
| 6,535,003 | B2 * | 3/2003 | Aldaz et al. ................. 324/754 |
| 7,053,638 | B2 | 5/2006 | Hsu et al. |
| 7,218,131 | B2 * | 5/2007 | Tanioka et al. .............. 324/762 |
| 7,271,603 | B2 | 9/2007 | Gleason et al. |
| 7,304,488 | B2 | 12/2007 | Gleason et al. |
| 7,629,803 | B1 * | 12/2009 | Ni ............................... 324/754 |
| 2009/0315576 | A1 * | 12/2009 | Ni ............................... 324/754 |

* cited by examiner

*Primary Examiner*—Jermele M Hollington
(74) *Attorney, Agent, or Firm*—Ming Chow; Sinorica, LLC

(57) ABSTRACT

Disclosed is a probe card assembly including a main body, a probe base provided at a center of the main body, and a plurality of test probes connecting the main body and the probe base. Therein, each of the test probes has a tip extending out from the probe base for contacting and testing a wafer. The test probes include at least one power probe, at least one grounding probe and a plurality of signal probes, wherein each of the test probes has a middle section between the main body and the probe base. Each of the power probe and the signal probes further contains therein a core that is wrapped by an insulation layer.

4 Claims, 4 Drawing Sheets

PROBE CARD ASSEMBLY

BACKGROUND OF THE INVENTION

1. Technical Field

The present invention relates to a probe card assembly and, more particularly, to a probe card assembly for testing semiconductor wafers.

2. Description of Related Art

In a process for manufacturing semiconductor wafers, test equipments and probe cards are typically used for testing dies on the wafers. Some prior arts, such as U.S. Pat. Nos. 7,053,638, 6,515,358, 6,137,297, 5,670,889, 7,271,603, 7,304,488 and 6,478,596, have proposed related approaches. A probe card has precise contacting means for contacting and electrifying each die on a wafer to test the dies and thereby ensure that the wafer is fabricated with electrical properties and performances answering to its design specifications. In recent years, the development of test equipments and probe cards tends toward high-frequency properties to adapt to the emerging semiconductor apparatuses capable of high-speed operation. However, when a traditional cantilever probe card having closely arranged test probes is used in high-frequency tests, noises brought by electromagnetic interference between the probes can significantly affect the consistency of test results and additional repeated tests may be required, resulting in reduced productivity and testing efficiency. Hence, a need exists for a structural improvement in the traditional probe card to remedy the problem of the prior arts.

SUMMARY OF THE INVENTION

In an attempt to overcome the defects of the prior arts, the present invention provides a probe card assembly and test probes used therein. The probe card assembly comprises a main body, a probe base provided at a center of the main body, and a plurality of test probes connecting the main body and the probe base. Therein, each of the test probes has a tip extending out from the probe base for contacting and testing a wafer. The test probes comprise at least one power probe, at least one grounding probe and a plurality of signal probes, wherein each of the test probes has a middle section between the main body and the probe base. Each of the power probe and the signal probes further contains therein a core that is wrapped by an insulation layer. The grounding probe is a bare probe with its middle section coated with a conductive adhesive that extends to a grounding end of the main body of the probe card assembly. At least one of the signal probes or the power probe also has its middle section coated with the conductive adhesive, which also extends to the grounding end of the main body of the probe card assembly. Thereby, the probe card assembly is enabled to transmit high-frequency signals smoothly.

Thus, a main objective of the present invention is to provide a probe card assembly for testing wafers with enhanced accuracy in high-frequency tests.

Another objective of the present invention is to provide a probe card assembly for testing wafers with significantly reduced noises during high-frequency tests.

An additional objective of the present invention is to provide a probe card assembly for testing wafers, wherein inductance between a power probe and a grounding probe of the probe card assembly can be effectively reduced.

BRIEF DESCRIPTION OF THE DRAWINGS

The invention as well as a preferred mode of use, further objectives and advantages thereof will best be understood by reference to the following detailed description of illustrative embodiments when read in conjunction with the accompanying drawings, wherein.

DETAILED DESCRIPTION OF THE PREFERRED EMBODIMENTS

Figure 1:
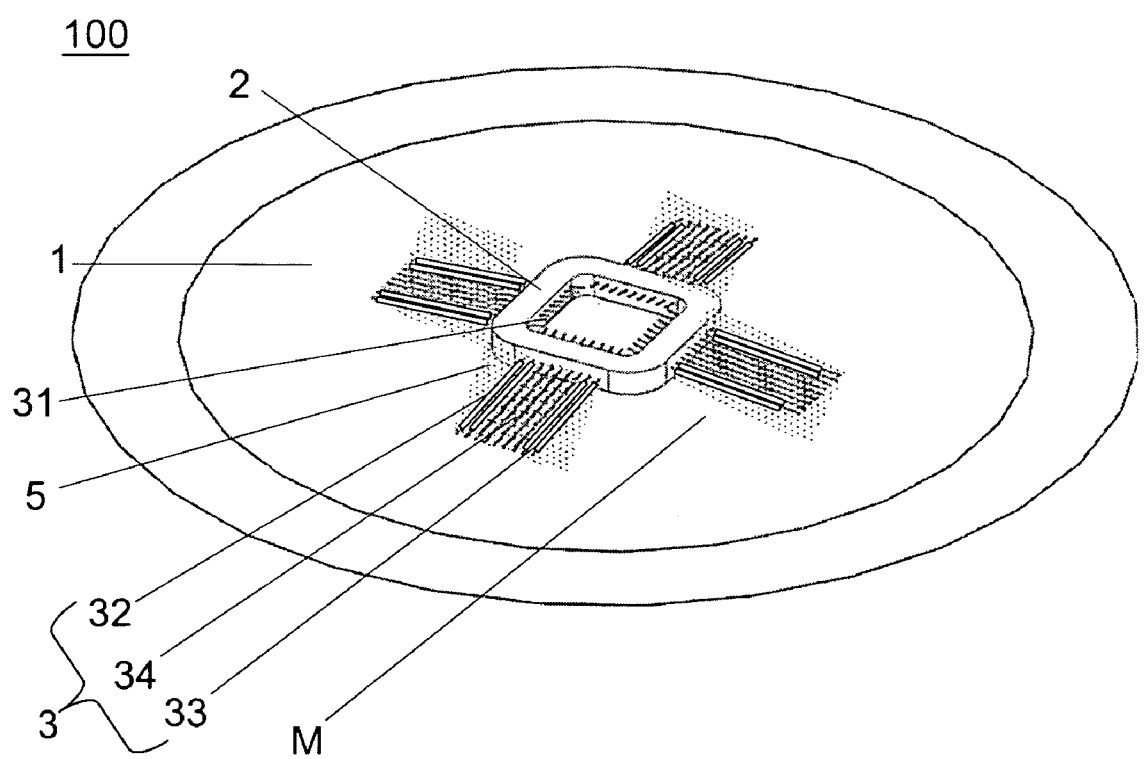
FIG. 1 is a schematic drawing of a probe card assembly according to a first preferred embodiment of the present invention.
Figure 2:
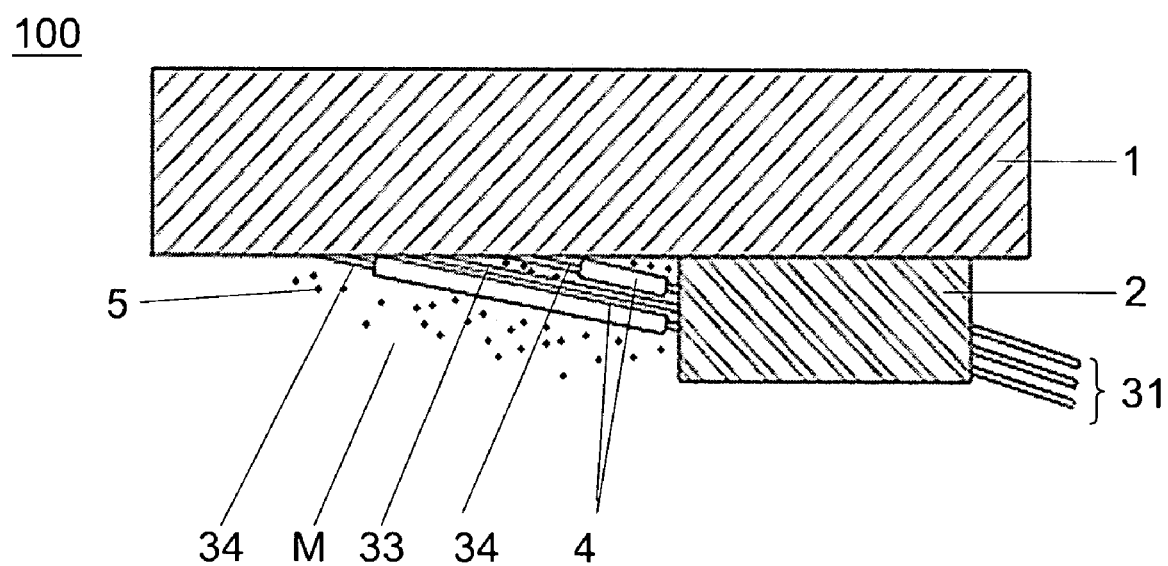
FIG. 2 is a partial, cross-sectional view of the probe card assembly according to the first preferred embodiment of the present invention.

The present invention provides a probe card assembly for probing a wafer. Since the operational principles and basic functions of the probe card assembly are well known to people of ordinary skill in the art, a detailed description of such principles and functions will be omitted herein. Meantime, the accompanying drawings to which the following description refers are intended to illustrate structural features of the present invention only schematically and therefore are not, and need not be, drawn to scale.

Please refer to FIGS. 1 through 4 for a probe card assembly 100 according to a first preferred embodiment of the present invention. The probe card assembly 100 primarily comprises a main body 1, a probe base 2 provided at a center of the main body 1, and a plurality of test probes 3 connecting the main body 1 and the probe base 2. The test probes 3 comprise at least one power probe 32, at least one grounding probe 33 and a plurality of signal probes 34. Each of the test probes 3 has a middle section M between the main body 1 and the probe base 2. Each of the test probes 3 further has a tip 31 extending out from the probe base 2 for contacting a wafer (not shown) and testing electrical properties thereof. Besides, each of the power probe 32 and the signal probes 34 further contains therein a core 35 that is wrapped by an insulation layer 4, whereas the grounding probe 33 is a bare probe without the insulation layer 4.

Figure 3:
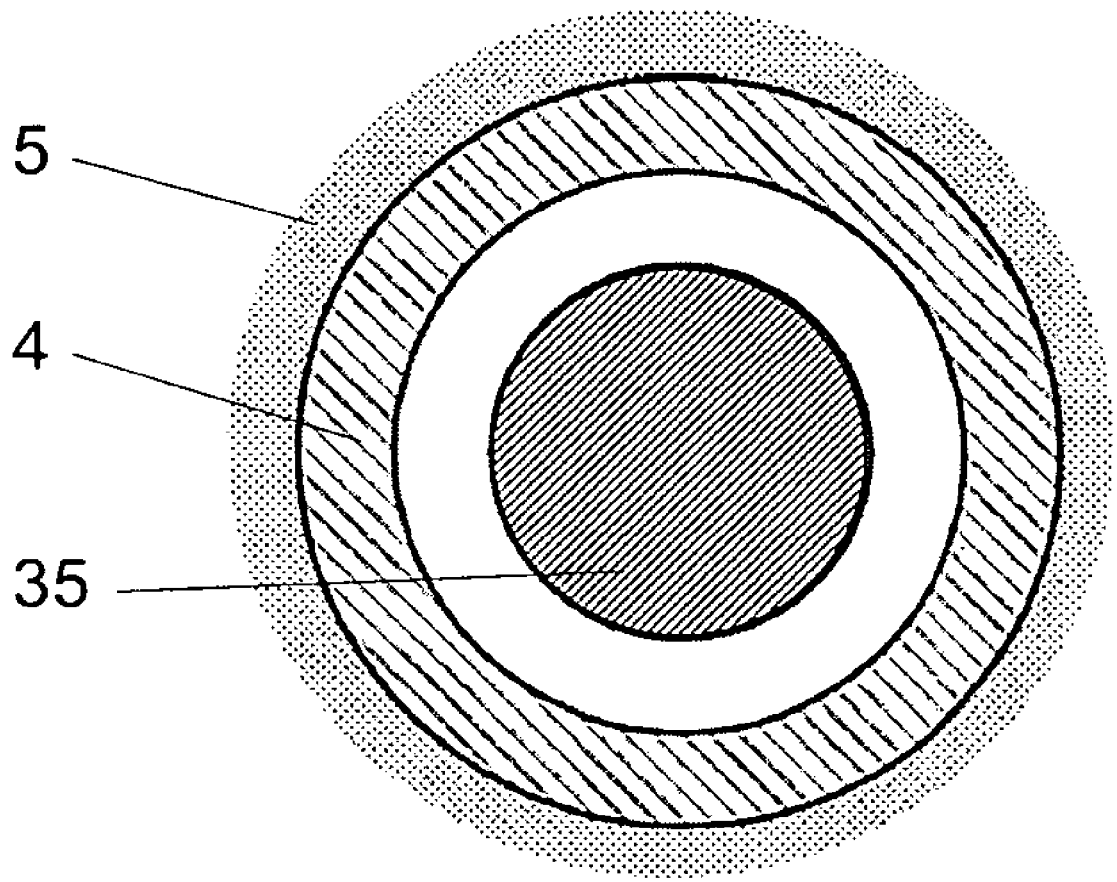
FIG. 3 is a cross-sectional view of a signal probe of the probe card assembly according to the first preferred embodiment of the present invention.
Figure 4:
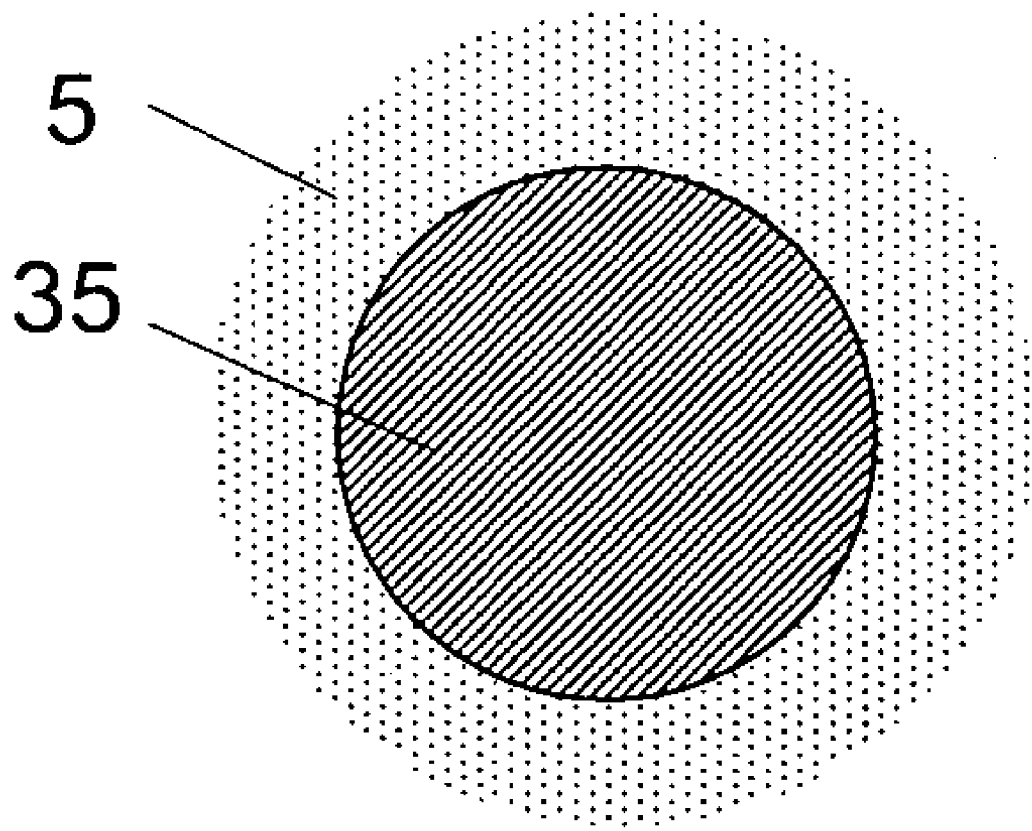
FIG. 4 is a cross-sectional view of a grounding probe of the probe card assembly according to the first preferred embodiment of the present invention.

In view that the closely arranged test probes 3 tend to suffer from mutual signal interference or excessive inductance, according to the present embodiment of the present invention, the middle sections M of the grounding probe 33 and of the signal probes 34 are coated with a conductive adhesive 5 that extends to a grounding end of the main body 1. The grounding end may further connect with a grounding layer in a PCB of the main body 1. FIG. 3 shows a cross-sectional view of one said signal probe 34, wherein the conductive adhesive 5 is applied to an outer surface of the insulation layer 4. FIG. 4 shows a cross-sectional view of the grounding probe 33, wherein the conductive adhesive 5 is applied to the core 35 of the bare probe. Thereupon, related high-frequency noises can be led to the grounding probe 33 and the grounding end via the conductive adhesive 5, so as to reduce inductance. Furthermore, as signals on the signal probes 34 are secured from loss and interference, the signal probes 34 are enabled to transmit high-frequency signals smoothly and perform high-frequency tests successfully. In addition, since signal interference is mostly attributed to high-frequency noises, the signal probes 34 in the present embodiment may be high-frequency signal probes (not shown). It is also noted that the conductive adhesive 5 functions better when coated on the high-frequency signal probes than on the normal signal probes 34.

According to a second preferred embodiment of the present invention, a probe card assembly 100 primarily comprises a main body 1, a probe base 2 provided at a center of the main body 1, and a plurality of test probes 3 connecting the main body 1 and the probe base 2. Unlike the first preferred embodiment, a conductive adhesive 5 in the present embodiment is applied to outer surfaces of middle sections M of the grounding probe 33 and of the power probe 32, and extends to a grounding end of the main body 1 so as to substantially reduce inductance between the power probe 32 and the grounding probe 33. Thereupon, related high-frequency noises can be led to the grounding probe 33 and the grounding end via the conductive adhesive 5 so that signals on the signal probes 34 are secured from loss and interference. Consequently, the signal probes 34 are enabled to transmit high-frequency signals smoothly and perform successful high-frequency tests. Other characteristics of the probe card assembly 100 of the present embodiment are similar to those disclosed in the first preferred embodiment.

According to a third preferred embodiment of the present invention, a probe card assembly 100 primarily comprises a main body 1, a probe base 2 provided at a center of the main body 1, and a plurality of test probes 3 connecting the main body 1 and the probe base 2. Unlike the first and the second preferred embodiments, all the power probe 32, grounding probe 33 and signal probes 34 in the present embodiment have outer surfaces of their middle sections M coated with a conductive adhesive 5 that extends to a grounding end of the main body 1 to achieve better results.

The present invention has been described with reference to preferred embodiments thereof and it is understood that the embodiments are not intended to limit the scope of the present invention. Moreover, as the contents disclosed herein should be readily understood and can be implemented by a person skilled in the art, all equivalent changes or modifications which do not depart from the spirit of the present invention should be encompassed by the appended claims.

What is claimed is:

1. A probe card assembly, comprising a main body, a probe base provided at a center of the main body, and a plurality of test probes connecting the main body and the probe base, wherein each of the test probes has a tip extending out from the probe base for contacting a wafer to be tested, and the test probes comprise at least one power probe, at least one grounding probe and a plurality of signal probes, in which each of the test probes has a middle section between the main body and the probe base, the probe card assembly being characterized in that:

the middle sections of at least one said grounding probe and at least one said signal probe have outer surfaces thereof coated with a conductive adhesive that extends to a grounding end of the main body of the probe card assembly, wherein the grounding probe is a bare probe without an insulation layer and each of the signal probes contains therein a core that is wrapped by an insulation layer.

2. The probe card assembly as claimed in claim 1, wherein the signal probe whose middle section is coated on the outer surface thereof with the conductive adhesive is a high-frequency signal probe.

3. A probe card assembly, comprising a main body, a probe base provided at a center of the main body, and a plurality of test probes connecting the main body and the probe base, wherein each of the test probes has a tip extending out from the probe base for contacting a wafer to be tested, and the test probes comprise at least one power probe, at least one grounding probe and a plurality of signal probes, in which each of the test probes has a middle section between the main body and the probe base, the probe card assembly being characterized in that:

the middle sections of at least one said grounding probe and at least one said power probe have outer surfaces thereof coated with a conductive adhesive that extends to a grounding end of the main body of the probe card assembly, wherein the grounding probe is a bare probe and the power probe contains therein a core that is wrapped by an insulation layer.

4. A probe card assembly, comprising a main body, a probe base provided at a center of the main body, and a plurality of test probes connecting the main body and the probe base, wherein each of the test probes has a tip extending out from the probe base for contacting a wafer to be tested, and the test probes comprise at least one power probe, at least one grounding probe and a plurality of signal probes, in which each of the test probes has a middle section between the main body and the probe base, the probe card assembly being characterized in that:

the middle sections of at least one said grounding probe and the test probes other than the grounding probe have outer surfaces thereof coated with a conductive adhesive that extends to a grounding end of the main body of the probe card assembly, wherein the grounding probe is a bare probe and each of the test probes other than the grounding probe contains therein a core that is wrapped by an insulation layer.

* * * * *